(12) United States Patent
Kumar et al.

(10) Patent No.: US 8,784,729 B2
(45) Date of Patent: Jul. 22, 2014

(54) HIGH DENSITY REFRACTORY METALS AND ALLOYS SPUTTERING TARGETS

(75) Inventors: Prabhat Kumar, Framingham, MA (US); Charles Wood, Coldwater, MI (US); Gary Rozak, Akron, OH (US); Steven A. Miller, Canton, MA (US); Glen Zeman, Coldwater, MI (US); Rong-Chein Richard Wu, Chelmsford, MA (US)

(73) Assignee: H.C. Starck Inc., Newton, MA (US)

( * ) Notice: Subject to any disclaimer, the term of this patent is extended or adjusted under 35 U.S.C. 154(b) by 1094 days.

(21) Appl. No.: 11/653,816

(22) Filed: Jan. 16, 2007

(65) Prior Publication Data

US 2008/0171215 A1     Jul. 17, 2008

(51) Int. Cl.
*B22F 1/00* (2006.01)
*B22F 1/02* (2006.01)

(52) U.S. Cl.
USPC .................................. 419/42; 75/228

(58) Field of Classification Search
USPC ................................ 419/42; 75/228
See application file for complete search history.

(56) References Cited

U.S. PATENT DOCUMENTS

| | | | |
|---|---|---|---|
| 3,116,146 A | 12/1963 | Gatti et al. | 75/214 |
| 4,612,162 A | 9/1986 | Morgan et al. | 419/28 |
| 4,670,216 A * | 6/1987 | Patrician et al. | 419/15 |
| 4,731,116 A | 3/1988 | Kny | 75/238 |
| 5,470,527 A | 11/1995 | Yamanobe et al. | 419/53 |
| 5,594,186 A | 1/1997 | Krause et al. | 75/228 |
| 5,693,203 A | 12/1997 | Ohhashi et al. | 204/298.12 |
| 5,774,780 A | 6/1998 | Prause | 419/12 |
| 6,165,413 A | 12/2000 | Lo et al. | 419/49 |
| 6,328,927 B1 | 12/2001 | Lo et al. | 419/45 |
| 6,331,233 B1 | 12/2001 | Turner | 204/298.13 |
| 6,350,407 B1 | 2/2002 | Sakata et al. | 419/38 |
| 6,626,976 B2 | 9/2003 | Khan et al. | 75/369 |
| 6,921,470 B2 | 7/2005 | Michaluk | 204/298.13 |
| 2004/0112176 A1 | 6/2004 | Khan et al. | 75/369 |
| 2006/0086205 A1 | 4/2006 | Johnson, Jr. et al. | 75/255 |
| 2007/0089984 A1* | 4/2007 | Gaydos et al. | 204/298.12 |
| 2007/0172378 A1* | 7/2007 | Shibuya et al. | 419/20 |

* cited by examiner

*Primary Examiner* — Weiping Zhu
(74) *Attorney, Agent, or Firm* — Bingham McCutchen LLP

(57) ABSTRACT

The present invention is directed to a process for producing high density, refractory metal products via a press/sintering process. The invention is also directed to a process for producing a sputtering target and to the sputtering target so produced.

9 Claims, 6 Drawing Sheets
(6 of 6 Drawing Sheet(s) Filed in Color)

HIGH DENSITY REFRACTORY METALS AND ALLOYS SPUTTERING TARGETS

BACKGROUND OF THE INVENTION

Several processing approaches exist for making high density refractory metal products. Such processes include rolling, HIP'ing (hot isostatic pressing), and hot pressing. Typical processes are described in U.S. Pat. Nos. 3,116,146, 4,612,162, 4,670,216, 4,731,116, 5,470,527, 5,594,186, 5,774,780, 6,165,413, 6,328,927, and 6,350,407. Rolling, hot pressing and HIP'ing have been widely used for making high-density plates for physical vapor deposition ("PVD") (e.g., for use as sputtering targets). Sintering techniques have not been employed in the production of sputtering targets because of an inability to consistently achieve high enough density.

The present invention is directed to a process for making refractory metal products, and particularly sputtering targets, by pressing and sintering of powders. The invention is also directed to thin films produced from such sputtering targets.

BRIEF DESCRIPTION OF THE FIGURES

The patent or application file contains at least one figure executed in color. Copies of this patent or patent application publication with color figure(s) will be provided by the Office upon request and payment of the necessary fee.

DESCRIPTION OF THE INVENTION

Figure 1:
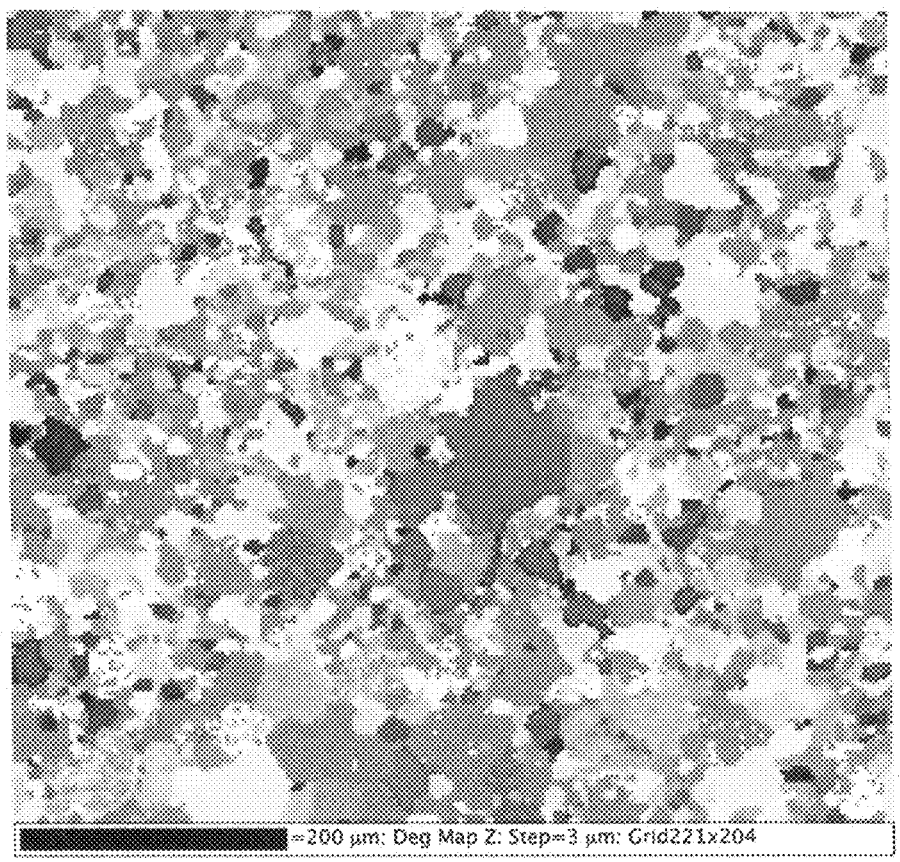
FIG. 1 is a texture grain map of a plate produced according to the present invention.

A process has now been discovered that allows for the production of refractory products (e.g., billets and/or plates) having densities >97% of the theoretical densities. A density of over 97% theoretical ensures closed and isolated pores. These pores do not have any adverse effect on the sputtering performance.

More particularly, the present invention is directed to a process for preparing a high density, refractory metal products (such as, e.g., billets and/or plates) comprising:

a) cold isostatically pressing a refractory metal powder at a pressure of from about 10,000 psi to about 65,000 psi to form a pressed product, said refractory metal powder being a powder selected from the group consisting of i) molybdenum powder, ii) tungsten powder, iii) molybdenum-tungsten alloy powder, iv) molybdenum alloy powder where the alloy metal is other than tungsten, and v) tungsten alloy powder where the alloy metal is other than molybdenum.

b) heating said pressed product with the temperature being increased at a rate of from about 20 to about 120° F. per hour to a first temperature of from about 300 to about 1000° F. and holding at said first temperature for a period of from about one to about thirty-eight hours, c) heating said pressed product from said first temperature with the temperature being increased at a rate of from about 20 to about 120° F. per hour to a second temperature of from about 1500 to about 2800° F. and holding at said second temperature for a period of from about one to about thirty-eight hours, d) heating said pressed product from said second temperature with the temperature being increased at a rate of from about 20 to about 120° F. per hour to a third temperature of from about 3000 to about 4000° F. and holding at said third temperature for a period of from about one to about thirty-eight hours, and e) allowing said pressed product to cool to room temperature.

The present invention is also directed to a process for preparing a sputtering target comprising a) cold isostatically pressing a refractory metal powder at a pressure of from about 10,000 psi to about 65,000 psi to form a pressed product, said refractory metal powder being a powder selected from the group consisting of i) molybdenum powder, ii) tungsten powder, iii) molybdenum-tungsten alloy powder, iv) molybdenum alloy powder where the alloy metal is other than tungsten, and v) tungsten alloy powder where the alloy metal is other than molybdenum.

b) heating said pressed product with the temperature being increased at a rate of from about 20 to about 120° F. per hour to a first temperature of from about 300 to about 1000° F. and holding at said first temperature for a period of from about one to about thirty-eight hours, c) heating said pressed product from said first temperature with the temperature being increased at a rate of from about 20 to about 120° F. per hour to a second temperature of from about 1500 to about 2800° F. and holding at said second temperature for a period of from about one to about thirty-eight hours, d) heating said pressed product from said second temperature with the temperature being increased at a rate of from about 20 to about 120° F. per hour to a third temperature of from about 3000 to about 4000° F. and holding at said third temperature for a period of from about one to about thirty-eight hours, e) allowing said pressed product to cool to room temperature, f) machining the resultant plate to the approximate size of the sputtering target desired, g) cleaning the machined plate, h) rinsing the cleaned the plate to remove any cleaning agent used in step g), and i) bonding the plate to a backing plate to form the sputtering target.

Finally, the present invention is directed to thin films produced from the sputtering targets.

The products produced i) have a fine grain size (typically <50 μm), ii) uniform texture (random orientation), and iii) are substantially free of texture banding. When used to produce thin films via sputtering, the resultant films exhibit higher thin film deposition rates, lower resistivities, and lower non-uniformity, when compared to thin films produced from conventional ingot-rolled targets. In addition, when compared to thin films produced from conventional HIPed targets, the films produced from the products of the present invention exhibit lower resistivities, and lower non-uniformity.

The press/sinter approach of the present invention has a significant cost advantage in the production of sputtering targets when compared with the existing processing routes of 1) hot isostatic pressing (HIP'ing), 2) hot pressing and 3)

rolling. The cost advantages come from shorter process cycle times and lower equipment operating costs. The processing routes of HIP and hot press have high processing equipment cost. The rolling processing route includes the first step of press and sintering, in addition to rolling steps.

The first critical element of the present invention resides in the particular starting powder characteristics. The powders used herein are molybdenum powders, tungsten powders, molybdenum-tungsten alloy powders, molybdenum alloy powders where the alloy metal is other than tungsten and tungsten alloy powders where the alloy metal is other than molybdenum. The powder size must be judiciously selected to meet the following processing and functional requirements: a) the pressed preform must have an adequate crush strength for subsequent handling in the sintering steps, b) the pressed preform must achieve the required densification in a reasonable time, and c) the pressed preform must achieve oxygen reduction during sintering.

A coarse powder will allow for the oxygen reduction, but will have difficulties in meeting other two requirements. Similarly, a fine powder will meet the crush strength and densification requirement, but will not provide the oxygen reduction during sintering. A Fischer sub-sieve size of from about 2 to about 5 microns as measured according to ASTM B-30-65 is generally adequate for the present invention.

Powders with the above-identified characteristics are prepared by techniques known in the art. For example, molybdenum powder can be produced with a two stage hydrogen reduction process with ammonium di-molybdate or molybdenum trioxide. The particles are refined/deagglomerated with air classifying, jet milling or other powder milling. The particle sizes are then classified with sieve or air levitation techniques. Useful devices for producing the metal powders are known and can be found, for example, in U.S. Pat. No. 6,626,976 and U.S. Patent application publications 2004/0112176 and 2006/00886205.

The first step of the process is cold isostatic pressing ("CIP"). The powder is poured into a rubber mold and jolted/tapped. It is sealed with a rubber stopper to prevent the fluid seeping into the rubber mold during operation. The sealed mold is then locked into the cold isostatic press vessel, and then closed. The pressure is then increased by pumping fluid into the vessel. Once the desired pressure is achieved, it is held for a period of time of from about 5 to about 30 minutes (and preferably from about 7 to about 20 minutes, and most preferably, for about 10 minutes). The desired pressure is from about 10,000 psi to about 65,000 psi (and preferably from about 15,000 to about 36,000 psi). The pressure is then released, and the vessel is open to allow the removal of the rubber mold with consolidated "green perform".

The second step of the process is the heating of the pressed product with the temperature being increased at a rate of from about 20 to about 120° F. per hour (preferably from about 70 to about 100° F.) to a first temperature of from about 300 to about 1000° F. (preferably from about 400 to about 700° F.) and holding at that temperature for a period of from about one to about thirty-eight hours (preferably from about 4 to about 12 hours).

The third step of the process is the pressed product from the first temperature with the temperature being increased at a rate of from about 20 to about 120° F. per hour (preferably from about 40 to about 60° F.) to a second temperature of from about 1500 to about 2800° F. (preferably from about 1700 to about 2200° F.) and holding at said second temperature for a period of from about one to about thirty-eight hours (preferably from about 10 to about 22 hours).

The fourth step of the process is the heating of the pressed product from the second temperature with the temperature being increased at a rate of from about 20 to about 120° F. per hour (preferably from about 25 to about 40° F.) to a third temperature of from about 3000 to about 4000° F. (preferably from about 3200 to about 3600° F.) and holding at said third temperature for a period of from about one to about thirty-eight hours (preferably from about 10 to about 24 hours).

Substantially any type of furnace known in the art can be used for steps 2 through 4. We have used radiation and industrial heating furnaces for these steps. Atmosphere in the furnace must be controlled to remove oxygen during sintering. We have used hydrogen atmosphere. Vacuum can also be used for sintering.

In a radiation furnace, heating elements of the furnace are heated by electrical energy. Heating elements emanate radiation energy which is absorbed by pressed perform. Absorption of the radiation energy raises the temperature of preform and results in its sintering.

Induction heating furnaces can also be used for these steps. The process relies on induced electrical currents within the material to produce heat. Induction heating is a method of providing fast, consistent heat for manufacturing applications which involve bonding or changing the properties of metals or other electrically-conductive materials.

Following the fourth step, the pressed product is allowed to cool to room temperature.

The process for producing sputtering targets broadly comprises the additional steps of: machining the plate to the approximate size of the target desired, cleaning the machined plate, rinsing the plate to remove the cleaning agent used and bonding the plate to a backing plate. These additional steps are known in the art and are typically used in preparing sputtering targets. For example, the milling step can use any suitable milling machine. As is known in the art, the cleaning agent used in the cleaning step can be sulfuric acid, peroxide, or water. The rinsing step typically uses alcohol to remove the cleaning agent from the surface of the target. Finally, the rinsed plate can be bonded to a backing using any of the techniques known in the art. Examples of these final steps can be found, e.g., U.S. Pat. Nos. 5,693,203, 6,331,233 and 6,921,470.

For large area sputtering application, the individual plates can be either HIP-bonded or welded to form a large area plates for sputtering on flat panel display glass substrates.

Example 1

Molybdenum metal powder (MMP powder) is produced from ammonium di-molybdate ("ADM") via a two stage process. The ADM is passed through a pusher boat where the ADM is hydrogen reduced to $MoO_2$ powder. The second stage further hydrogen reduces the $MoO_2$ to molybdenum powder with a pusher pan.

The powder was then "air-classified". The "air classifier" levitates the powder in an air stream. As the powders collide in the air stream, they break up into smaller particles. The air pressure blows the smaller particles into a separate location from the larger size particles. Thus the air classifier fractionates the powders based on particle size and density. Commercially available classifiers are made by Hosokawa Alpine Division, and the air classifier model used to make the precursor powders of this example Alpine 400 MPV1.

The MMP powder with an average Fisher size of 3.9 microns was then cold isostatically pressed into a cylinder of 3 inches in length and a diameter of 2.65 inches. The pressed samples were then sintered at two different temperatures.

For the 3250° F. run, the part was first heated to 400° F. with a heating rate of 100° F. per hour, and held at that temperature for 4 hours. The part was then heated to 2000° F. with a heating rate of 55° F. per hour, and held at that temperature for 4 hours. Finally, the part was heated to 3250° F. with a heating rate of 35° F. per hour, and held at that temperature for 16 hours.

For the 3800° F. run, the part was first heated to 400° F. with a heating rate of 100° F. per hour, and held at that temperature for 12 hours. The part was then heated to 2000° F. with a heating rate of 55° F. per hour, and held at that temperature for 6 hours. Finally, the part was heated to 3800° F. with a heating rate of 35° F. per hour, and held at that temperature for 8 hours.

The densities of sintered samples were measured in accordance with ASTM B311. Table 1 gives densities as a percentage of theoretical density (10.22 gm/cm$^3$) for the two different sintering temperatures.

TABLE 1

| Sintering Temp. | Density (% of Theo) |
| --- | --- |
| 3250° F. | 97.8% |
| 3800° F. | 98.7% |

It is evident that both temperatures gave over 97% of the theoretical density.

Example 2

For a calcined metal powder (CMP powder), ADM is first passed through a rotary kiln reduction to $MoO_3$, followed by hydrogen reduction to $MoO_2$. The powder is then further reduced to molybdenum. The resultant powder is then air-classified in a manner similar to Example 1.

The CMP powder with an average Fisher size of 3.7 microns was then cold isostatically pressed into a cylinder of 3 inches in length and a diameter of 2.65 inches. The pressed cylinders were sintered at two different temperatures as described in Example 1.

Table 2 gives densities as a percentage of theoretical density (10.22 gm/cm$^3$) for the two different sintering temperatures.

TABLE 2

| Sintering Temp. | Density (% of Theo) |
| --- | --- |
| 3250° F. | 97.2% |
| 3800° F. | 98.2% |

It is evident that both temperatures gave over 97% of the theoretical density.

Example 3

In an embodiment of the invention, the plates have a texture that is free of texture banding and has random orientation, as characterized by Electron Beam Scattering Diffraction (EBSD).

"Texture" in the context of Materials Science means "crystallographic preferred orientation". A sample in which these orientations are fully random is said to have no texture. If the crystallographic orientations are not random, but have some preferred orientation, then the sample has a weak, strong, or moderate texture. EBSD converts the difference of the amount of scattered electrons by focusing position into the difference of brightness of image. The EBSD gets orientation information of specimens by applying Kikuchi diffraction pattern that is formed when specimen is tilted about 70°.

A molybdenum sample was made by press/sinter at 3250° F. cycle (as described in Example 1) with MMP powder of Fisher size of 4 38 microns, resulting in 97% density plate. The sample was then characterized by EBSD at high resolution (3 μm step size) after being mounted, polished and etched. The selection of step size is based on sample's grain size to ensure that small features are not missed while completing EBSD scan at reasonable time.

The texture grain map relative to the normal to the sample surface is shown in the FIG. 1. Grains oriented within 20° of 100 are designated as blue, within 20° of 111 yellow, and within 20° of 110 red, with the color getting darker as the disorientation decreases. The gray color indicated grains oriented in between the three orientations.

The pole figure is the stereographic projection of the orientation distribution of crystallographic lattice planes in crystallography and texture analysis. The orientation of each individual grain can be given by its normal line. Therefore each point in the pole figures represents the stereoprojection of the normal line of individual grains.

Figure 2:
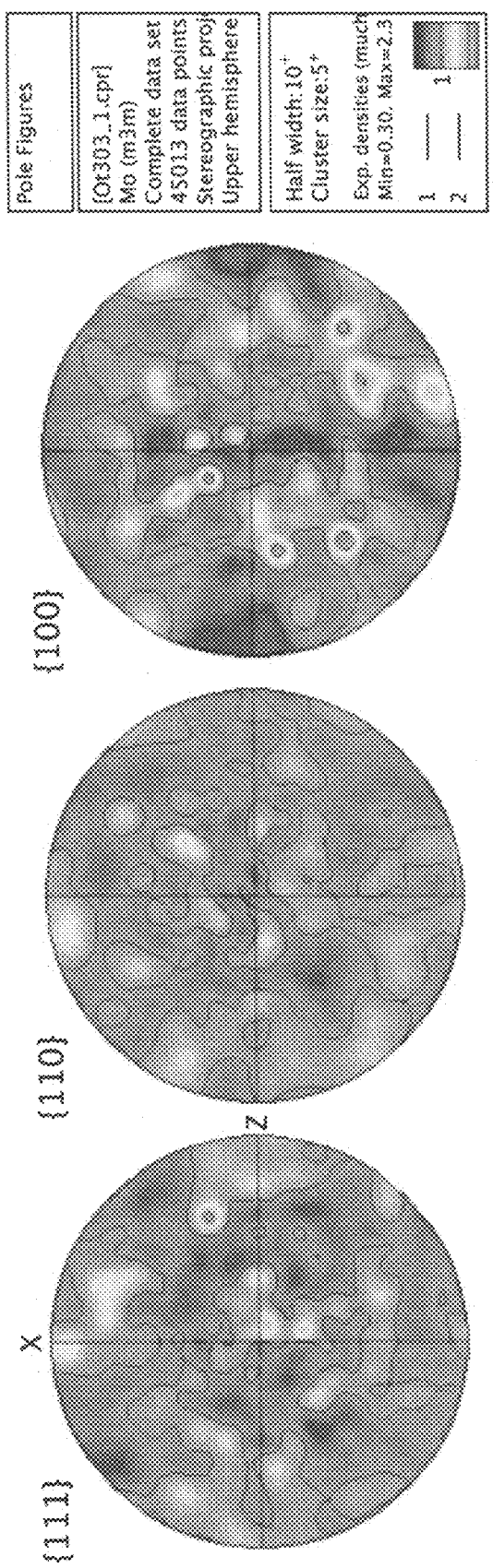
FIG. 2 is a pole figure of the plate produced according to the present invention.

The pole figures for the press/sinter sample is presented in FIG. 2. It shows no real patterns, indicating random orientation. There are lower intensity blue areas in {100} pole figure, corresponding to the some lack of blue grains in FIG. 1.

The conclusion that can be made from FIGS. 1 and 2 is that the press/sinter plates have a texture that is free of texture banding, and has random orientation.

Example 4

For comparison purpose, a rolled-recrystallized plate sample was made by cold-isostatic pressing a MMP powder with Fisher size of 4.1 microns, sintered at 3250° F. with holding time for 10 hours. The pate was then subjected to uni-directional rolling, flattening, and recrystallization at 1832° F. (1000° C.), resulting in a 99.5% density.

Figure 3:
FIG. 3 is a texture grain map of a plate produced according to a prior art process.

The sample was then characterized by EBSD after being mounted, polished and etched. A map of half the thickness of the plate sample, which was scanned with a 20 μm step, is shown in FIG. 3 with the surface at the top and mid-thickness at the bottom. The larger step size (20 μm) was selected due to the larger grains of the rolled-recrystallized sample, compared to those of the sample of Example 3. As in Example 3, the color designations are blue for 100 grain orientation, yellow for 111, and red for 110, with gray in between the three orientations. Comparing to press/sinter sample in FIG. 2, the rolled-recrystallized sample consisted of relatively coarser grains with an elongated shape.

Figure 4:
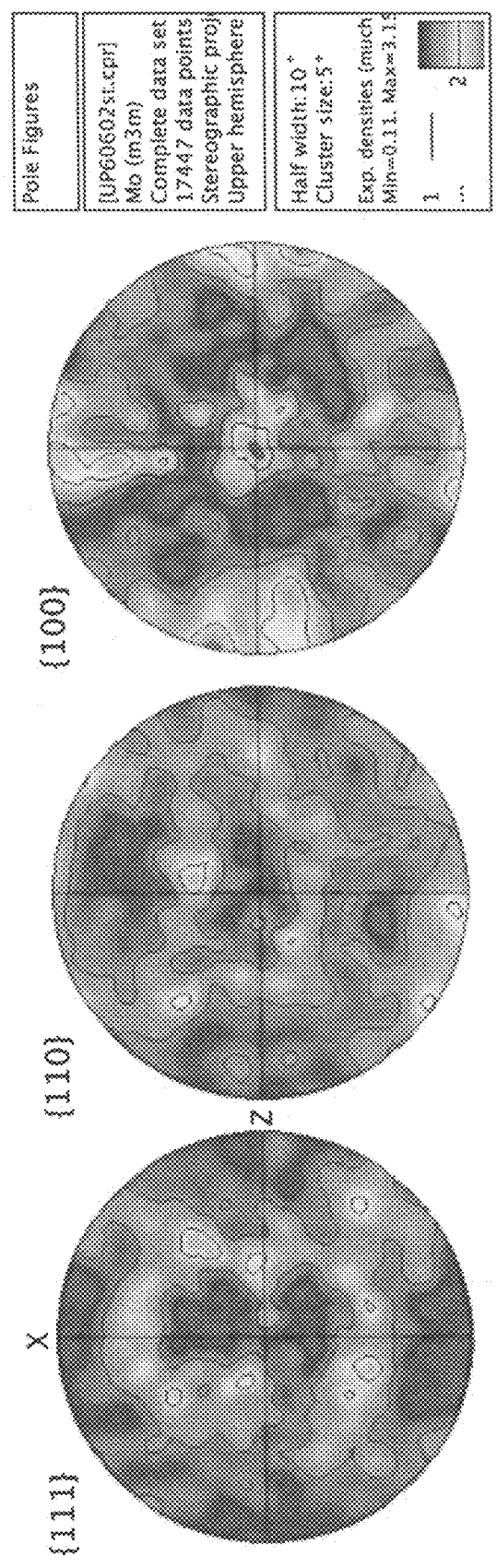
FIG. 4 is a pole figure of the plate produced according to a prior art process.

The pole figures are shown in FIG. 4. The texture of the rolled sample is stronger than those of press/sinter sample in FIG. 2, as the peak maximum is 3.1 times random (with the intensity of random orientation being 1). The main feature for rolled-recrystallized sample is 100 grain orientation.

In comparison with press/sinter sample in Example 3, the rolled-recrystallized sample has a much stronger texture in 100 orientation, with banding also being evident.

Example 5

Figure 5:
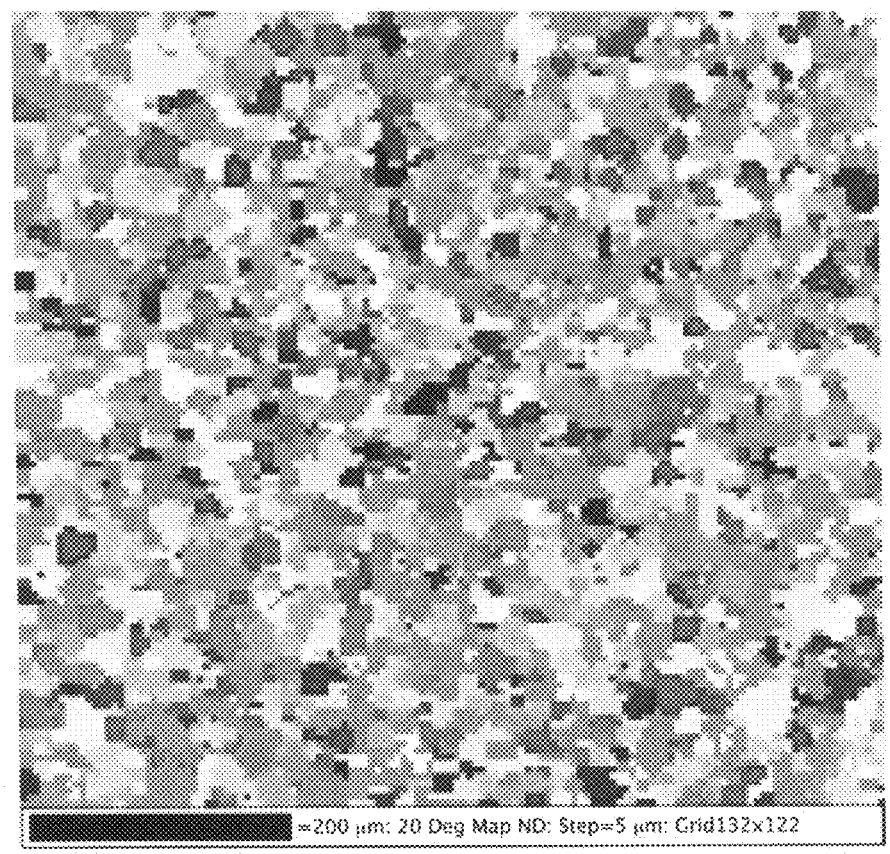
FIG. 5 is a texture grain map of a plate produced using a HIP process.

A HIPed sample was made by cold-isostatic pressing of a MMP powder with Fisher size of 4 microns at 16 ksi, sintered at 3250° F. with a holding time for 10 hours. The plate was then subjected to Hot-Isostatic Pressing at 1240° C., 15 ksi for 10 hours, resulting in a density of 98.6%. The sample was then characterized by EBSD with a 5 μm step, after being mounted, polished and etched. The EBSD map is shown in FIG. 5 with the color designation—blue for 100 grain orientation, yellow for 111, and red for 110, with gray in between the three orientations. The texture grain map showed that HIPed sample consisted of fine grains. There was no sign of texture banding, nor was a through-thickness texture gradient evident.

Figure 6:
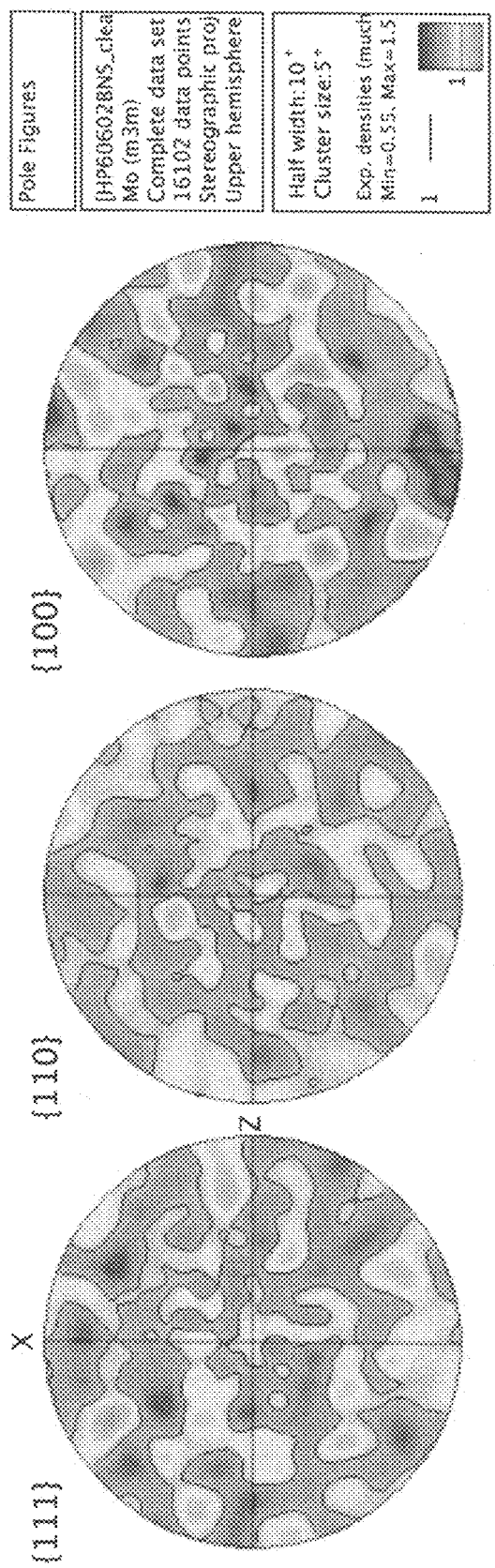
FIG. 6 is a pole figure of a plate produced using a HIP process.

The pole figure is shown in FIG. 6. It shows no real patterns, indicating random orientation.

Example 6

The present invention also provides a thin film made by physical vapor deposition (PVD). The thin films can be used in electronic components such as semiconductor devices, thin film transistors, TFT-LCD devices for flat panel display, solar cell.

For comparison purpose, three 5" size of samples from Examples 3, 4 and 5 were used for thin film deposition via magnetron sputtering. The glass substrates were chemically cleaned by successive rinsing in ultrasonic baths of acetone and ethyl alcohol before being placed in the chamber.

The substrate surfaces were then sputter-cleaned first, followed by target cleaning at 500 W (DC) for 10 minutes at 2 milli-Torr in the PVD chamber. During this step a shutter was positioned in front of the target to prevent deposition on the substrates.

The thin film depositions on the substrates were performed on the power mode (fixed power applied to the target) under different conditions of gas pressure (1, 3 and 5 mTorr) and time (2 minutes and 30 minutes). And the substrate-source-spacing was maintained at 5".

Four tests were carried out for thin film characterization. For the etch rate at room temperature, a ferricyanide solution is used. The resistivity was measured by a 4-point probe. The uniformity was determined through sheet resistance measurement of 37 points. The deposition rate was measured by the cross section of the film sample under SEM. Table 3 sets for the results obtained.

TABLE 3

| Targets | | Thin Film Characterization | | | | |
|---|---|---|---|---|---|---|
| | | Deposition | Resistivity | | | |
| | Density | Rate | ($\mu\Omega \cdot cm$) | | Etch Rate | Non-Uniformity |
| Target ID | (%) | (Å/min) | 200 nm | >1 μm | (μm/min) | (%) |
| Rolled & Recrystallized Mo | 99.5 | 1047 | 22.4 | N.A. | 0.83 | 7.7 |
| HIPed Mo | 98.6 | 1122 | 15.4 | 9.40 | 0.77 | 6.0 |
| Press/Sinter Mo | 97 | 1144 | 14.5 | 8.41 | 0.94 | 4.6 |

The results for thin film sputtering from the three different targets are summarized below:

a) the deposition rate for the press/sinter target is the highest among three targets;

b) the resistivity for the press/sinter target is the lowest among the three targets;

c) the etch rate for the press/sinter target is the highest among the three targets; and d) the non-uniformity for the press/sinter target is the lowest among the three targets.

Lower non-uniformity, lower resistivity, and higher deposition & chemical etch rates are desired properties in the thin films for applications in flat panel display, semiconductor devices, and solar cells.

While the above description represents the preferred embodiments, various changes and modifications may be made without departing from the spirit and scope of the present invention.

The invention claimed is:

1. A method of forming a sputtering-target plate that is sputterable to form highly uniform, low-resistivity films of a refractory metal selected from the group consisting of molybdenum, tungsten, an alloy of molybdenum and tungsten, molybdenum alloyed with a metal other than tungsten, and tungsten alloyed with a metal other than molybdenum, the method comprising:

cold isostatically pressing a powder of the refractory metal at a pressure selected from the range of 15,000 psi to 36,000 psi to form a pressed product;

heating the pressed product under vacuum at a rate of about 20° F. to about 120° F. to a first temperature selected from the range of about 300° F. to about 1000° F. and holding the pressed product at the first temperature for a period selected from the range of about 1 hour to about 38 hours;

heating the pressed product under vacuum at a rate of about 20° F. to about 120° F. from the first temperature to a second temperature selected from the range of about 1500° F. to about 2800° F. and holding the pressed product at the second temperature for a period selected from the range of about 1 hour to about 38 hours;

heating the pressed product under vacuum at a rate of about 20° F. to about 120° F. from the second temperature to a third temperature selected from the range of about 3000° F. to about 4000° F. and holding the pressed product at the third temperature for a period selected from the range of about 1 hour to about 38 hours;

allowing the pressed product to cool to room temperature; and machining the pressed product to a desired size, thereby forming the sputtering-target plate that is sputterable to form highly uniform, low-resistivity films of the refractory metal, the sputtering-target plate having a density greater than 97% of a theoretical density of the refractory metal.

2. The method of claim 1, further comprising bonding the sputtering-target plate to a backing plate.

3. The method of claim 1, wherein the powder has a Fischer sub-sieve size of from about 2 to about 5 microns as measured according to ASTM B-30-65.

4. The method of claim 1, wherein cold isostatically pressing the powder comprises holding the powder at pressure for a period of about 5 minutes to about 30 minutes.

5. The method of claim 1, wherein cold isostatically pressing the powder comprises holding the powder at pressure for a period of about 7 minutes to about 20 minutes.

6. The method of claim 1, wherein (i) the first temperature is selected from the range of about 400° F. to about 700° F., (ii) heating to the first temperature comprises heating at a rate of about 70° F. to about 100° F., and (iii) the pressed product is held at the first temperature for a period selected from the range of about 4 hours to about 12 hours.

7. The method of claim 1, wherein (i) the second temperature is selected from the range of about 1700° F. to about 2200° F., (ii) heating to the second temperature comprises heating at a rate of about 40° F. to about 60° F., and (iii) the pressed product is held at the second temperature for a period selected from the range of about 10 hours to about 22 hours.

8. The method of claim 1, wherein (i) the third temperature is selected from the range of about 3200° F. to about 3600° F., (ii) heating to the third temperature comprises heating at a rate of about 25° F. to about 40° F., and (iii) the pressed product is held at the third temperature for a period selected from the range of about 10 hours to about 24 hours.

9. The method of claim 1, further comprising, after machining the pressed product, cleaning the machined pressed product and, thereafter, rinsing the machined pressed product.

* * * * *